United States Patent
Miyatake

(10) Patent No.: US 7,583,541 B2
(45) Date of Patent: Sep. 1, 2009

(54) ASYNCHRONOUS SEMICONDUCTOR MEMORY

(75) Inventor: Hisatada Miyatake, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 11/764,884

(22) Filed: Jun. 19, 2007

(65) Prior Publication Data

US 2008/0013385 A1    Jan. 17, 2008

(30) Foreign Application Priority Data

Jun. 28, 2006 (JP) ............... 2006-177535
May 9, 2007 (JP) ............... 2007-124077

(51) Int. Cl.
*G11C 7/10* (2006.01)

(52) U.S. Cl. ............ 365/189.05; 365/230.06; 365/233.5

(58) Field of Classification Search ............ 365/189.01, 365/189.05, 230.06, 233, 233.5
See application file for complete search history.

(56) References Cited

U.S. PATENT DOCUMENTS

| | | | |
|---|---|---|---|
| 5,748,558 A | 5/1998 | Suzuki | |
| 5,973,987 A * | 10/1999 | Akai et al. | 365/230.06 |
| 6,365,473 B1 * | 4/2002 | Lee | 438/303 |
| 6,735,139 B2 * | 5/2004 | Tang | 365/222 |
| 7,298,661 B2 * | 11/2007 | Miyatake | 365/222 |

FOREIGN PATENT DOCUMENTS

| | | |
|---|---|---|
| JP | 2001-357671 | 12/2001 |
| JP | 2003187575 | 12/2001 |
| JP | 2002269977 | 9/2002 |
| JP | 2003308692 | 11/2002 |
| JP | 2004319053 | 4/2003 |
| JP | 2003-196975 | 7/2003 |
| JP | 2004-280947 | 10/2004 |
| JP | 2004-342219 | 12/2004 |
| JP | 2004-342222 | 12/2004 |
| JP | 2004-342223 | 12/2004 |
| JP | 2007-066490 | 3/2007 |

* cited by examiner

*Primary Examiner*—Gene N. Auduong
(74) *Attorney, Agent, or Firm*—Anthony J. Canale; Shimokaji & Associates

(57) ABSTRACT

An asynchronous pseudo SRAM having compatibility with asynchronous SRAMs. A read request or a write request of data is provided at arbitrary timing to the asynchronous pseudo SRAM, the asynchronous pseudo SRAM includes a memory cell array comprising dynamic memory cells; an array control circuit that is activated in response to an access enable signal, the array control circuit reads data from or writes data in the memory cell array in response to address signals, and the array control circuit activates a busy signal during reading or writing of data; an access reception circuit for receiving the read request or the write request to activate an access wait signal and inactivating the access wait signal in response to the access enable signal; and an access activation circuit for activating the access enable signal in response to activation of the access wait signal and inactivation of the busy signal.

2 Claims, 13 Drawing Sheets

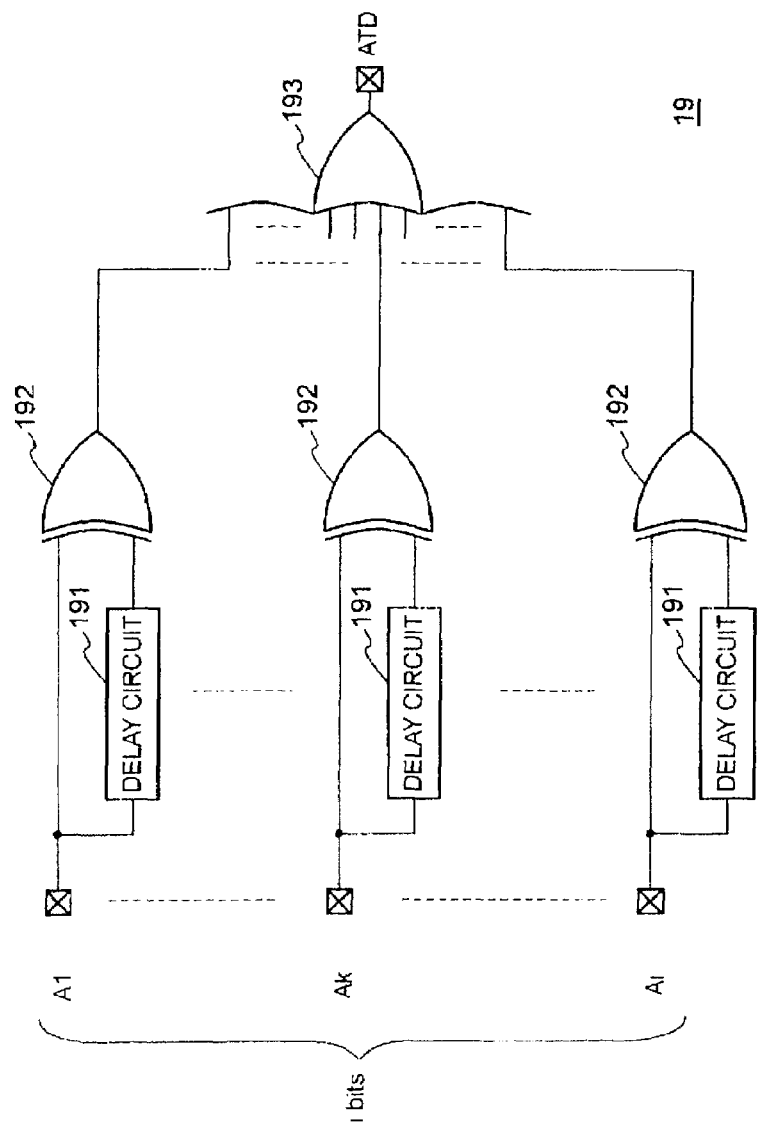

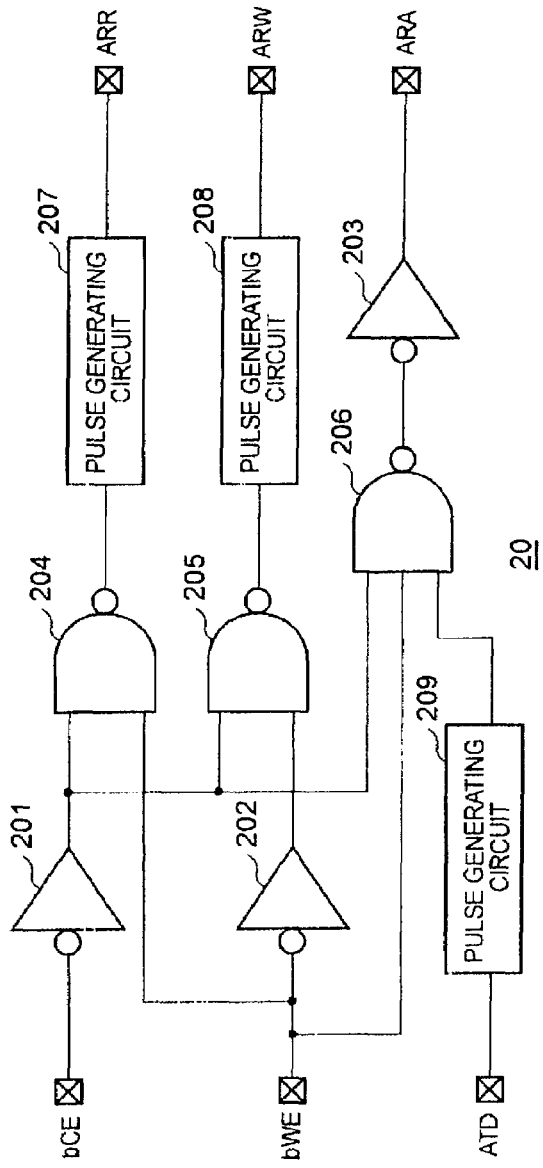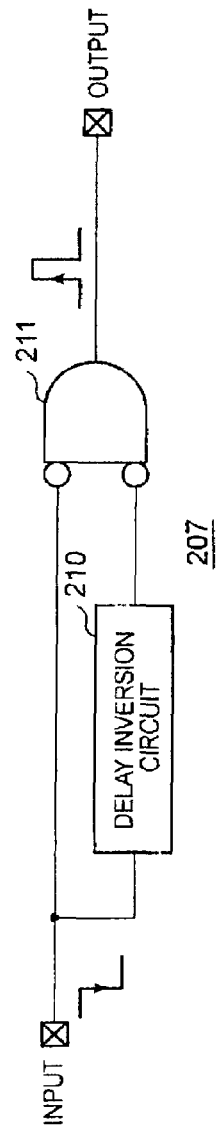

ASYNCHRONOUS SEMICONDUCTOR MEMORY

RELATED PATENT APPLICATION

This application is related to commonly assigned U.S. patent application Ser. No. 11/460,299, "Semiconductor Memory Device", filed on Jul. 27, 2006, and incorporated in its entirety herein by reference.

FIELD OF THE INVENTION

The present invention relates to a memory device, and more specifically relates to an asynchronous pseudo SRAM (Static Random Access Memory) using dynamic memory cells.

BACKGROUND OF THE INVENTION

Conventionally, SRAMs and DRAMs (Dynamic Random Access Memory) have widely been used as rewritable semiconductor memories. SRAMs have mainly been used when high-speed operation is required, while DRAMs have been used when large storage capacity is required.

In DRAMs, since data signals read from memory cells are small, it is required to perform a series of operations including steps of: precharging/equalizing bit lines to a predetermined voltage before reading, driving word lines to connect the memory nodes of memory cells with bit lines; amplifying the small data signals appearing on the bit lines; turning bit switches on to read out data to the outside of the memory cell array, thereafter or simultaneously therewith, restoring data into the original memory cells, and precharging/equalizing the bit lines. In the case of writing too, it is required to perform substantially similar operations except that external write data are delivered to the bit lines before the restoration mentioned above. It is impossible to stop such a series of operations on the way, once the driving of word lines is started. This is because data is destructively read from the memory cells by driving word lines, regardless of whether the cycle is a read cycle or a write cycle.

In portable devices such as cellular phones, SRAMs have been widely used because they can be easily used and the necessary storage capacity is not so large, but recently, in order to support applications requiring large data capacity such as images or the like, pseudo SRAMs (PSRAM, VSRAM, or the like) have come to be used, which use the same dynamic memory cells as those of DRAMs adapted to provide a large storage capacity and in which the external interface and the external control method are the same or substantially same as those of SRAMs. Since pseudo SRAMs use the dynamic memory cells, they require the refresh operation. There are two types of pseudo SRAMs in terms of the refresh control; one requires external instructions to perform the refresh operation and the other does not require the same. As a matter of course, the type which does not require the instructions to perform the refresh operation is apparently superior in ease of use to the other, but since it is necessary to complete the refresh control within pseudo SRAMs, the configuration and the internal control in such pseudo SRAMs become complicated. In addition, the mainstream of the external interfaces of pseudo SRAMs is the same as that of the external interfaces of synchronous SRAMs. It is considered that designing the synchronous type SRAMs is easier than designing the asynchronous type SRAMs, since it is necessary to complete a series of operations as described above when the dynamic memory cells are used. However, pseudo SRAMs aiming at having interfaces similar to those of asynchronous SRAMs have recently begun to be proposed.

For example, Japanese Unexamined Patent Publication No. 2002-269977 discloses an asynchronous pseudo SRAM using dynamic memory cells. In this pseudo SRAM, transition of address signals is detected by an ATD (Address Transition Detection) circuit and an ATD signal is generated. The ATD signal is activated for a period required for accessing the memory cell array (for example, 100 nanoseconds). An internal circuit control signal is then generated on the basis of the ATD signal, and row-system circuits and column-system circuits are controlled. The reason why the activation period of the ATD signal, namely the internal circuit control signal, is prolonged is described herein ". . . because the read operation, for example, of the row-system circuits of the memory performs a series of operations including steps of: latching row addresses; selecting word lines on the basis of the addresses to read out data of the memory cells onto bit lines; and sense-amplifying minute potential generated on the bit lines by sense amplifiers to bring the potential of the bit lines to intended end potential levels . . . " (see paragraph 0018 of the Publication No. 2002-269977).

Namely, this pseudo SRAM apparently performs asynchronous operation triggered by transition of the address signals, but when the address signals transit and the internal circuit control signal is once activated, no new access requests are accepted, and all of them are disregarded during the long activation period.

In addition, according to specifications of asynchronous SRAMs, it is allowed to activate the write enable signal /WE to perform a write request before elapse of a time required for access from activation of the chip enable signal /CE to a series of operations as described above, but the pseudo SRAM described in the Publication No. 2002-269977 does not satisfy even these specifications. Namely, since it is unpredictable, at the time the chip enable signal /CE is activated, whether or not the write enable signal /WE is activated, the pseudo SRAM has to start the read operation in preparation for the case that the write enable signal /WE would not be activated. This is because inactivation of the write enable signal /WE at the time the chip enable signal /CE is activated means a read request. Hence, once the read operation is started, it is impossible to receive any new access requests until a series of operations as described above are finished.

Japanese Unexamined Patent Publication No. 2003-308692 proposes measures to be taken in a case where the initial rise of the write enable signal /WE is late. Asynchronous SRAM imports write data with the rise of one of the write enable signal /WE and the chip enable signal /CE which is earlier than the other. According to the specifications of asynchronous SRAMs, it is assumed that there is no problem no matter how late the rising time of the write enable signal /WE from the start of the write cycle may be. Therefore, in order to deal with such a case, the pseudo SRAM according to the Publication No. 2003-308692 separately generates an internal circuit control signal in the case of write operations. However, as in the case of the pseudo SRAM according to the Publication No. 2002-269977, this pseudo SRAM can not deal with a write request by a falling edge of the write enable signal /WE after the chip enable signal /CE falls.

Japanese Patent No. 3170146 discloses a semiconductor memory which has realized a late write system, but, the system applies to synchronous SRAM, neither to asynchronous SRAM nor to asynchronous pseudo SRAM.

As described above, there are proposals for bringing the interface of pseudo SRAMs close to that of asynchronous SRAMs, but, no pseudo SRAMs which satisfy the specifications of asynchronous SRAMs and have compatibility with the same in operation as well have yet been realized.

SUMMARY OF THE INVENTION

It is an aspect of the present invention to provide an asynchronous memory device using dynamic memory cells and having compatibility with asynchronous SRAM.

An asynchronous memory device (e.g. an asynchronous semiconductor memory device) is provided according to the present invention, in which a read request and a write request of data are provided at arbitrary timing. The asynchronous semiconductor memory device is provided with a memory cell array or memory cell arrays, an array control circuit, an access reception circuit, and an access activation circuit. The memory cell array includes dynamic memory cells. The array control circuit is activated in response to an access enable signal. The activated array control circuit reads data from the memory cell array in response to address signals, or writes data in the memory cell array in response to the address signals. The array control circuit also generates a busy signal during reading or writing of data. The access reception circuit receives the read request or the write request to activate an access wait signal and inactivates the access wait signal in response to the access enable signal. The access activation circuit activates the access enable signal in response to activation of the access wait signal and inactivation of the busy signal.

According to the present invention, a read request or a write request is first received by the access reception circuit and the access wait signal is then activated. The access enable signal is then activated when the access wait signal is activated and the busy signal is inactivated. This causes the access wait signal to be inactivated, enabling reception of a next read request or write request. Hence, even if a read request or a write request is provided at arbitrary timing, the read operation or the write operation is performed in response to the request.

In an embodiment of the present invention, the access reception circuit includes an access request signal generating circuit and an access wait circuit. The access request signal generating circuit activates access request signals in response to a read request or a write request. The access wait circuit activates the access wait signal in response to activation of one of the access request signals and inactivates the access wait signal in response to the access enable signal.

In another embodiment, the access reception circuit further includes an address transition detection circuit. The address transition detection circuit detects transition of address signals to generate an address transition detection signal. The access request signal generating circuit activates a read access request signal in response to activation of a chip enable signal and inactivation of a write enable signal, activates a write access request signal in response to activation of the chip enable signal and activation of the write enable signal, and activates an address access request signal in response to activation of the chip enable signal, inactivation of the write enable signal and activation of the address transition detection signal. The access wait circuit activates the access wait signal in response to activation of the read access request signal, the write access request signal, or the address access request signal. In this case, all of three kinds of access requests compliant with specifications of asynchronous SRAMs are received and combined into one kind of access wait signal.

In still another embodiment, the asynchronous semiconductor memory device is further provided with a logic circuit. The logic circuit activates an internal write enable signal in response to activation of a chip enable signal and activation of a write enable signal. An array control circuit imports data into a memory cell array when the internal write enable signal becomes inactivated. In this case, when either one of the chip enable signal and the write enable signal both in activation becomes inactivated from the activated state, data provided from outside of the asynchronous semiconductor memory device is imported into the memory cell array. Accordingly, this asynchronous semiconductor memory device complies with the specifications of asynchronous SRAMs.

In still yet another embodiment, the asynchronous semiconductor memory device is further provided with a latch circuit. The latch circuit latches address signals and a write enable signal in response to the access enable signal and provides the same to the array control circuit. In this case, the array control circuit performs a read or write operation of data in response to the address signals and the write enable signal which have been provided upon starting access to the array. Hence, the access request last received becomes effective and the access request received before then is disregarded. For that reason, an unnecessary operation is not performed.

In still yet another embodiment, the asynchronous semiconductor memory device is further provided with a register and a latch circuit. The register holds address signals and data provided from outside of the asynchronous semiconductor memory device when the chip enable signal or the write enable signal is inactivated after the chip enable signal and the write enable signal were activated. The latch circuit latches the address signals held by the register in response to the access enable signal when the write enable signal is activated. The array control circuit imports data held by the register in response to the address signals latched by the latch circuit. In this case, data is written late, namely, when the next write request is received.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 2 is a circuit diagram of the ATD circuit shown in FIG. 1;

FIG. 3 is a circuit diagram of the access request signal generating circuit shown in FIG. 1;

FIG. 4 is a circuit diagram of the pulse generating circuit shown in FIG. 3;

DETAILED DESCRIPTION OF THE INVENTION

Figure 1:
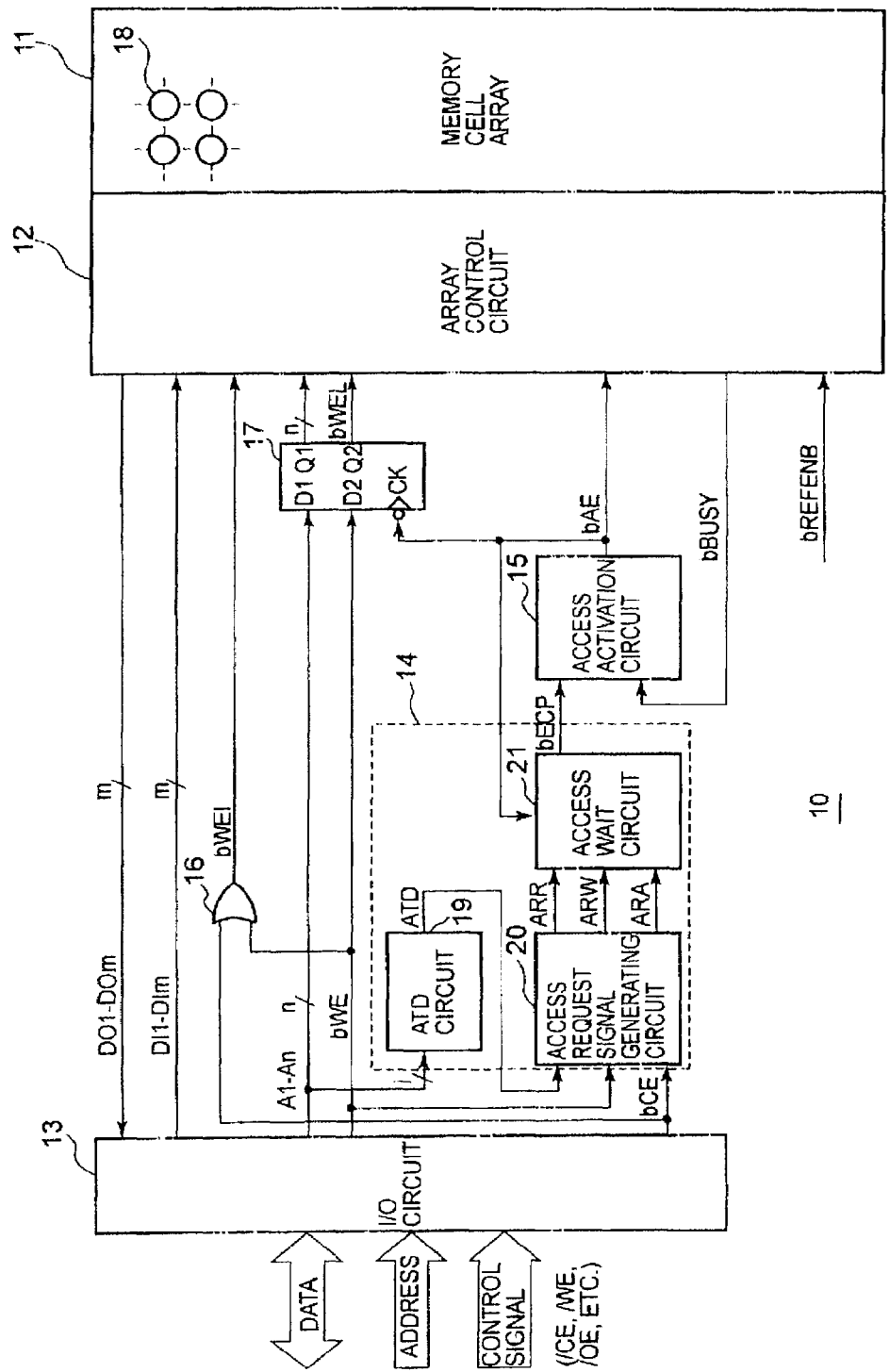
FIG. 1 is a functional block diagram illustrating a configuration of an asynchronous pseudo SRAM according to an embodiment of the present invention.

Preferred embodiments of the present invention will be described in detail with reference to the drawings. The same numerals are given to the same or equivalent parts throughout the drawings, and the description thereof will not be repeated. It should be noted that a symbol "/" (slash) in front of an external signal represents that the external signal is active at a logic low level. A reference character "b" attached in front of an internal signal represents that the internal signal is active at a logic low level. Hereafter, the logic low level is described as "L" and a logic H level is described as "H".

Referring to FIG. 1, an asynchronous pseudo SRAM 10 according to an embodiment of the present invention is provided with a memory cell array or memory cell arrays 11, an array control circuit 12, an input/output circuit 13, an access reception circuit 14, an access activation circuit 15, an OR circuit 16, and a latch circuit 17. Asynchronous pseudo SRAM 10 has compatibility with asynchronous SRAMs, and can receive a read request and a write request of data at arbitrary timing.

The memory cell array 11 includes a plurality of dynamic memory cells 18 arranged in a matrix form. Each dynamic memory cell 18 is composed of, for example, a transistor (not illustrated) and a capacitor (not illustrated), and stores 1 bit of data by charging an electric charge in the capacitor. The memory cell array 11 further includes a plurality of word lines (not illustrated) arranged in rows and a plurality of bit line pairs (not illustrated) arranged in columns. The dynamic memory cells 18 are arranged at positions corresponding to intersections between the word lines and the bit lines.

The array control circuit 12 is activated in response to an access enable signal bAE, and accesses the memory cell array 11 in response to n-bit address signals, A1-An, provided from outside of asynchronous pseudo SRAM 10. Specifically, the array control circuit 12 reads m-bit data from the memory cell array 11, outputs data as output data signals DO1-DOm via the I/O circuit 13, and writes m-bit input signals DI1-DIm provided via the I/O circuit 13 into the memory cell array 11. The array control circuit 12 also refreshes the memory cell array 11 in response to a refresh enable signal bREFENB. The array control circuit 12 activates a busy signal bBUSY during operation.

As a refreshing method, the method disclosed in related U.S. patent application Ser. No. 11/460,299 may be employed, but, any method may be employed as long as the refresh enable signal bREFENB that is properly controlled so as not to interrupt the external access is generated. In the case of complying with the method disclosed in related U.S. patent application Ser. No. 11/460,299 mentioned above, it is only necessary to provide a refresh wait circuit (not illustrated) for generating a refresh wait signal in response to a refresh request and a refresh start circuit (not illustrated) for generating the refresh enable signal bREFENB. The refresh start circuit generates the refresh enable signal bREFENB in response to inactivation of an access wait signal bECP (H level), activation of the refresh wait signal, and inactivation of the busy signal bBUSY (H level). The refresh enable signal bREFENB is inhibited while the access wait signal bECP is activated (L level). Such signals that directly control the access activation circuit 15 or other external access control circuits are not outputted from the refresh wait circuit or the refresh start circuit. It is only necessary for the access activation circuit 15 to monitor the busy signal bBUSY from the array control circuit 12. Although this asynchronous pseudo SRAM 10 performs a refresh by itself, the same may perform the refresh in response to external instructions.

The configuration of the array control circuit 12 is not illustrated in detail because it has a well-known configuration, but in particular, it is composed of predecoders, row decoders, column decoders, bit switches, sense amplifiers, decoders, control circuits for the sense amplifiers, and the like.

The I/O circuit 13 performs output of the data signals DO1-DOm, input of the data signals DI1-DIm, input of the external address signals A1-An, input of control signals, and the like. The control signals include an external chip enable signal /CE, an external write enable signal /WE, an external output enable signal /OE, and the like. Specifically, the I/O circuit 13 generates an internal chip enable signal bCE in response to the external chip enable signal /CE. The I/O circuit 13 also generates an internal write enable signal bWE in response to the external write enable signal /WE.

The access reception circuit 14 receives an access request (a read request or a write request) provided from outside to activate the access wait signal bECP and inactivates the access wait signal bECP in response to the access enable signal bAE. The access activation circuit 15 generates the access enable signal bAE in response to activation of the access wait signal bECP (L level) and inactivation of the busy signal bBUSY (H level). The OR circuit 16 activates an internal write enable signal bWEI (L level) in response to activation of the internal chip enable signal bCE (L level) and activation of the internal write enable signal bWE (L level). The latch circuit 17 contains a delay flip-flop (DFF) and latches the external address signals A1-An in response to the access enable signal bAE to provide the array control circuit 12 with the same. The latch circuit 17 also latches the internal write enable signal bWE in response to the access enable signal bAE and provides the array control circuit 12 with the same as the internal write enable signal bWEL.

The access reception circuit 14 specifically includes an access request signal generating circuit 20 and an access wait circuit 21. The access request signal generating circuit 20 activates various access request signals ARR, ARW, and ARA in response to access requests. The access wait circuit 21 activates the access wait signal bECP in response to activation of the access request signals ARR, ARW, and ARA (H level), and inactivates the access wait signal bECP in response to the access enable signal bAE.

The access reception circuit 14 further includes an address transition detection (ATD) circuit 19. The ATD circuit 19 detects transition of the address signals A1-Ai to generate an address transition detection signal ATD. The ATD circuit 19 is provided with the i-bit address signals A1-Ai to be targeted out of n-bit address signals A1-An.

More specifically, the access request signal generating circuit 20 activates the read access request signal ARR in response to a read request indicated by active state of the internal chip enable signal bCE (L level) and inactive state of the internal write enable signal bWE (H level). The access request signal generating circuit 20 also activates the write access request signal ARW in response to a write request indicated by active state of the internal chip enable signal bCE (L level) and active state of the internal write enable signal bWE (L level). The access request signal generating circuit 20 further activates the address access request signal ARA in response to a read request indicated by active state of the internal chip enable signal bCE (L level), inactive state of the internal write enable signal bWE (H level), and active state of the address transition detection signal ATD (H level). The access wait circuit 21 becomes reset in response to the access enable signal bAE and inactivates the access wait signal bECP to H level. The access wait circuit 21 also activates the access wait signal bECP to L level in response to activation (H level) of the read access request signal ARR, the write access request signal ARW, or the address access request signal ARA.

Referring to FIG. 2, the ATD circuit 19 includes i pieces of delay circuits 191, i pieces of exclusive OR circuits 192, and an OR circuit 193. Each of the exclusive OR circuits 192 turns its output signal to H level for a time period of the delay time of the delay circuit 191 when the corresponding 1-bit address signal Ak (k=1 to i) changes. Hence, the OR circuit 193 generates a pulse-form address transition detection signal ATD when at least one bit signal out of the address signals A1 through Ai changes.

Referring to FIG. 3, the access request signal generating circuit 20 includes inverters 201-203, NAND circuits 204-206 and pulse generating circuits 207-209. The pulse generating circuit 207 is a differential circuit, as illustrated in FIG. 4, and includes a delay inversion circuit 210 and a logic circuit 211. The delay inversion circuit 210 delays the input signal for a predetermined time period and inverts the same. Hence, the pulse generating circuit 207 generates a pulse signal at H level having a predetermined width in response to a falling edge of the input signal. Much the same is true on other pulse generating circuits 208 and 209.

Pursuant to the specifications of asynchronous SRAMs, the access request signal generating circuit 20 is activated in response to the chip enable signal bCE at L level so as to receive the external access request only when the external chip enable signal/CE is at L, level. When the chip enable signal bCE reaches the L level while the write enable signal bWE is being at H level, or when the write enable signal bWE reaches the H level while the chip enable signal bCE is being at L level, the short pulse-form read access request signal ARR is outputted. When the chip enable signal bCE reaches the L level while the write enable signal bWE is being at L level, or when the write enable signal bWE reaches the L level while the chip enable signal bCE is being at L level, the short pulse-form write access request signal ARW is outputted.

When the address transition detection signal ATD reaches the H level while the chip enable signal bCE is being at L level and the write enable signal bWE is being at H level, the short pulse-form address access request signal ARA is outputted. It is not permitted to activate a write operation at the transition of the address signals in the asynchronous SRAM, either. This is because there is a probability of writing unintended data into the memory cell 18. Hence, the address access request signal ARA is not outputted when the write enable signal bWE is at L level.

Figure 5:
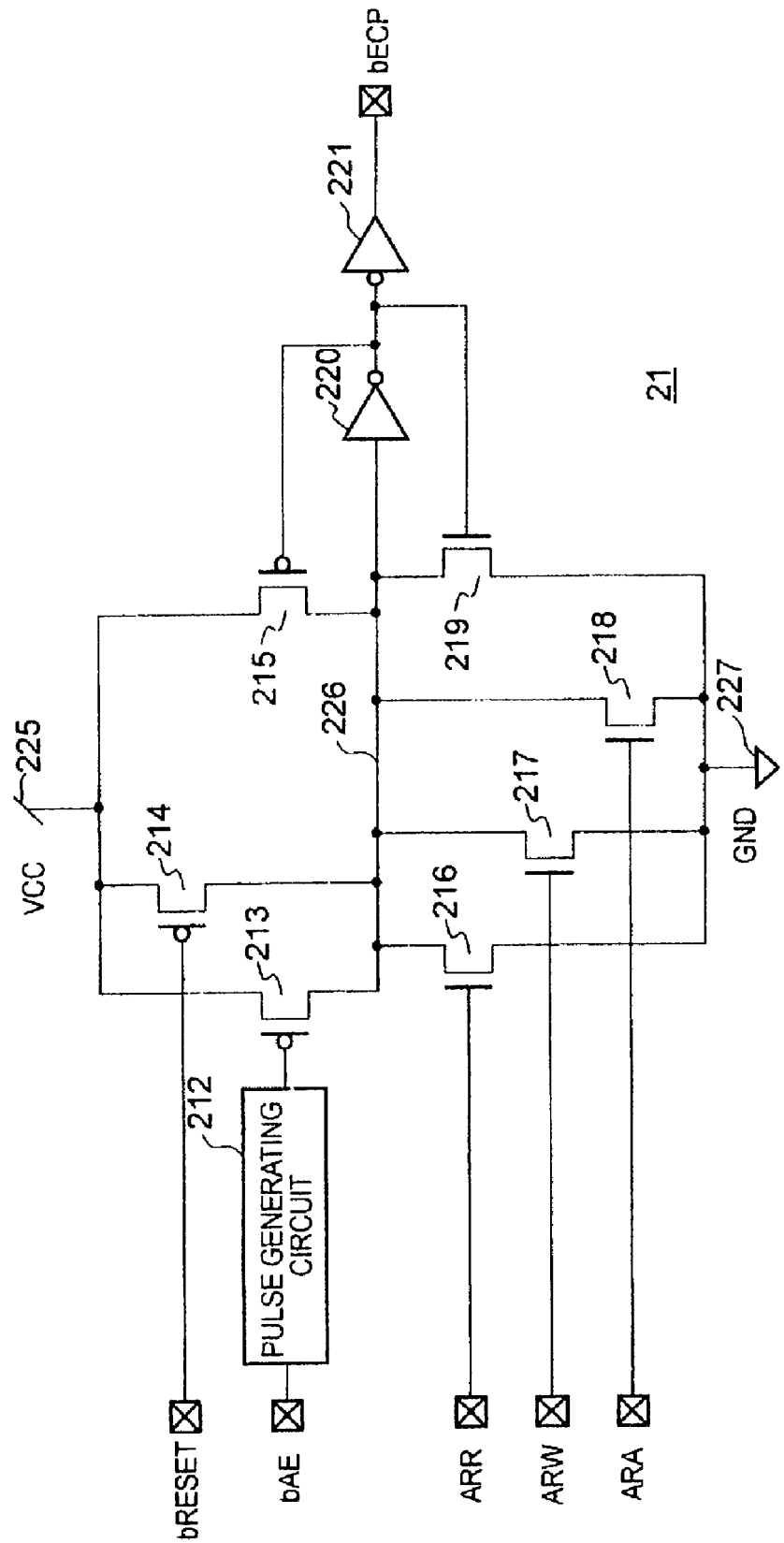
FIG. 5 is a circuit diagram of the access wait circuit shown in FIG. 1.
Figure 6:
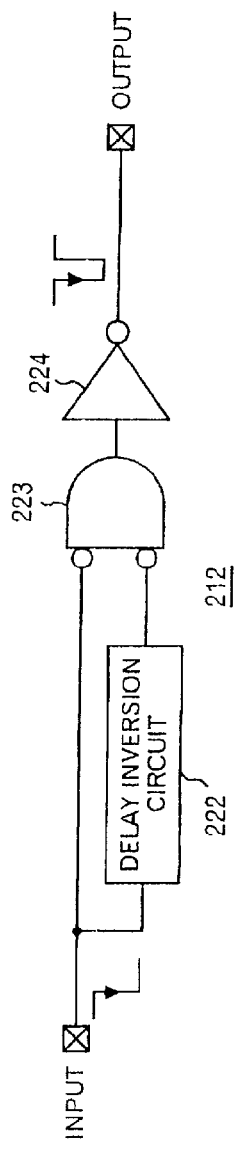
FIG. 6 is a circuit diagram of the pulse generating circuit shown in FIG. 5.

Referring to FIG. 5, the access wait circuit 21 includes a pulse generating circuit 212, P channel field-effect transistors 213-215, N channel field-effect transistors 216-219, and inverters 220 and 221. The pulse generating circuit 212 includes a delay inversion circuit 222, a logic circuit 223, and an inverter 224, as illustrated in FIG. 6. The pulse generating circuit 212 includes the delay inversion circuit 222, the logic circuit 223, and the inverter 224, and generates a pulse signal at L level having a predetermined width in response to the falling edge of the input signal.

The P channel field-effect transistor 213 is connected between a power node 225 and a state node 226. The pulse generating circuit 212 holds the P channel field-effect transistor 213 turned on for a predetermined period in response to the access enable signal bAE. The P channel field-effect transistor 214 is connected between the power node 225 and the state node 226, and is turned on in response to a reset signal bRESET. The P channel field-effect transistor 215 is connected between the power node 225 and the state node 226, and has a gate connected to an output terminal of the inverter 220. The N channel field-effect transistor 216 is connected between a grounding node 227 and the state node 226, and is turned on in response to the read access request signal ARR. The N channel field-effect transistor 217 is connected between a grounding node 227 and the state node 226, and is turned on in response to the write access request signal ARW. The N channel field-effect transistor 218 is connected between the grounding node 227 and the state node 226, and is turned on in response to the address access request signal ARA. The N channel field-effect transistor 219 is connected between the grounding node 227 and the state node 226, and has a gate connected to the output terminal of the inverter 220. Here, sizes of the transistors 215 and 219, specifically W/L (W is gate width and L is gate length), are smaller than those of other transistors 213-214, and 216-218. Hence, the driving capabilities of the transistors 215 and 219 are smaller than those of other transistors 213, 214 and 216 through 218.

Since the reset signal bRESET becomes L level when the power is turned on, the transistor 214 is turned on and the state node 226 is initialized to a power supply potential VCC. Hence, the transistor 215 is turned on and the transistor 219 is turned off. As a result, the state node 226 is latched at H level, and the access wait signal bECP is inactivated to H level.

If the read access request signal ARR temporarily becomes H level, the transistor 216 is turned on. If the write access request signal ARW temporarily becomes H level, the transistor 217 is turned on. If the address access request signal ARA temporarily becomes H level, the transistor 218 is turned on. Since the driving capabilities of the transistors 216-218 are larger than the driving capabilities of the transistor 215, the state node 226 is discharged to a grounding potential GND when any one of the transistors 216-218 is turned on, and as opposed to the above, the transistor 215 is turned off while the transistor 219 is turned on. As a result, the state node 226 is latched at L level, and the access wait signal bECP is activated to L level.

Once the access wait signal bECP is activated, the access wait signal bECP is maintained in the activated state even if the access request signals ARR, ARW, and ARA are further activated.

After the access wait signal bECP having been activated, when the access enable signal bAE becomes L level, the transistor 213 is temporarily turned on. Since the driving capability of the transistor 213 is larger than the driving capability of the transistor 219, the state node 226 is recharged to the power supply potential VCC, and is reset. As a result, the state node 226 is latched at H level, and the access wait signal bECP is inactivated to H level.

Figure 7:
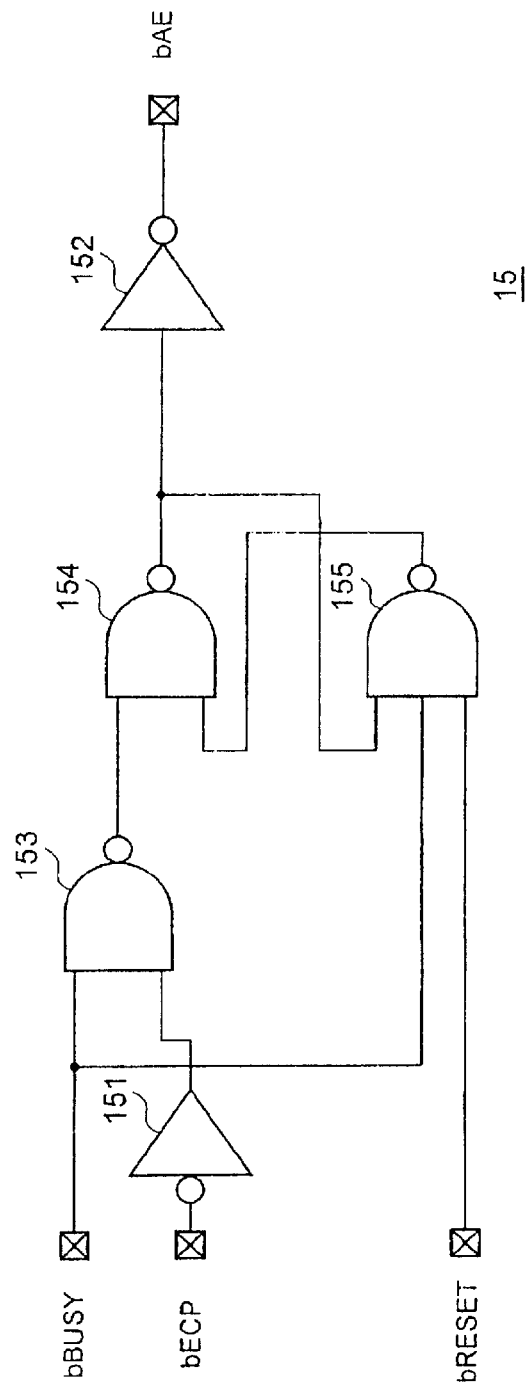
FIG. 7 is a circuit diagram of the access activation circuit shown in FIG. 1.

Referring to FIG. 7, the access activation circuit 15 includes inverters 151 and 152, and NAND circuits 153-155. The NAND circuits 154 and 155 constitute RS flip-flops. When the access wait signal bECP is at L level and the busy signal bBUSY is at H level, the access enable signal bAE is activated to L level. While the busy signal bBUSY is at L level, the access enable signal bAE is never activated. Once becoming the L level, the access wait signal bECP maintains the L level as long as the access enable signal bAE is not activated, and therefore, the access enable signal bAE is activated when the busy signal bBUSY is reset at H level. When the busy signal bBUSY is activated to L level, the access enable signal bAE is reset at H level. The access activation circuit 15 is initialized in response to the reset signal bRESET.

Next, operation of asynchronous pseudo SRAM 10 will be described.

Figure 8:
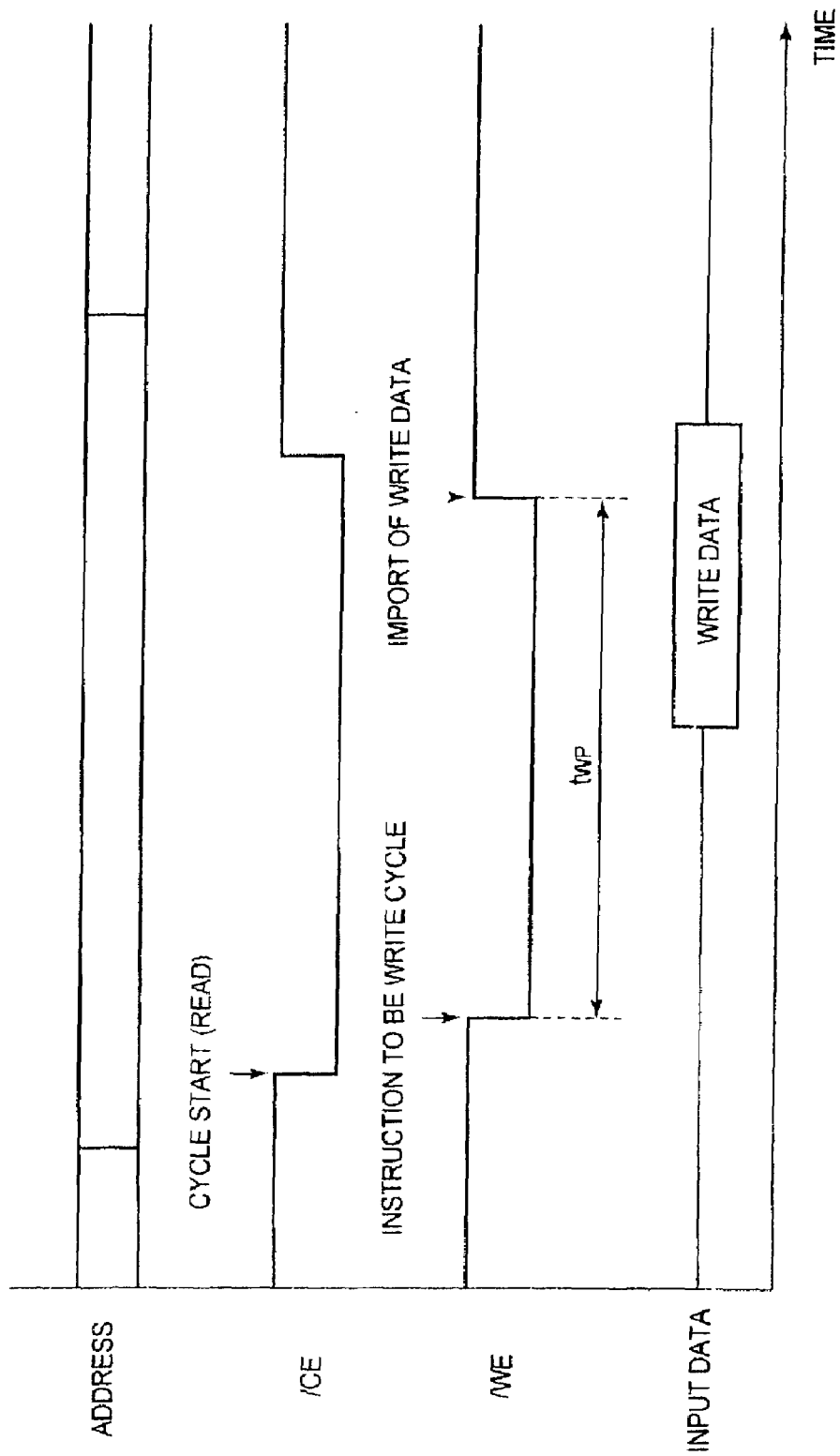
FIG. 8 is an exemplary timing chart illustrating write operation of asynchronous SRAMs.

FIG. 8 illustrates an exemplary timing relationship of external signals in the write operation of asynchronous SRAMs. In inputting such external signals, asynchronous SRAMs operate as follows. First, asynchronous SRAMs are activated by the falling edge of the chip enable signal /CE, and since the write enable signal /WE is at H level at this time, the read operation starts. Next, when the write enable signal /WE transits to L level, the operation is switched to the write operation even while the read operation is being performed. If the read operation is already finished, the write operation newly starts. Write data is imported at the rising edge of the write enable signal /WE and written into the memory cells, and after that, since the chip enable signal /CE is at L level and the write enable signal /WE is at H level, data read from the memory cells in accordance with address information provided at that time appears on the data terminal after the access time. Asynchronous SRAM is inactivated when the chip enable signal /CE returns to H level.

Asynchronous pseudo SRAM 10 needs to import input data as write data, pursuant to the specifications of asynchronous SRAMs illustrated in FIG. 8, when either one of the chip enable signal /CE and the write enable signal /WE is reset to H level after both the chip enable signal /CE and the write enable signal /WE are set to L level. Specifically, when the external chip enable signal /CE or the external write enable signal /WE is reset to H level, the internal write enable signal bWEI is reset to H level by the OR circuit 16 illustrated in FIG. 1. In response thereto, the array control circuit 12 imports input data DI1-DIm in the memory cell array 11. As described above, in the write operation of data, it is necessary to wait for input of write data during a period of write signal pulse width tWP from falling of the write enable signal /WE to re-rising thereof.

Figure 9:
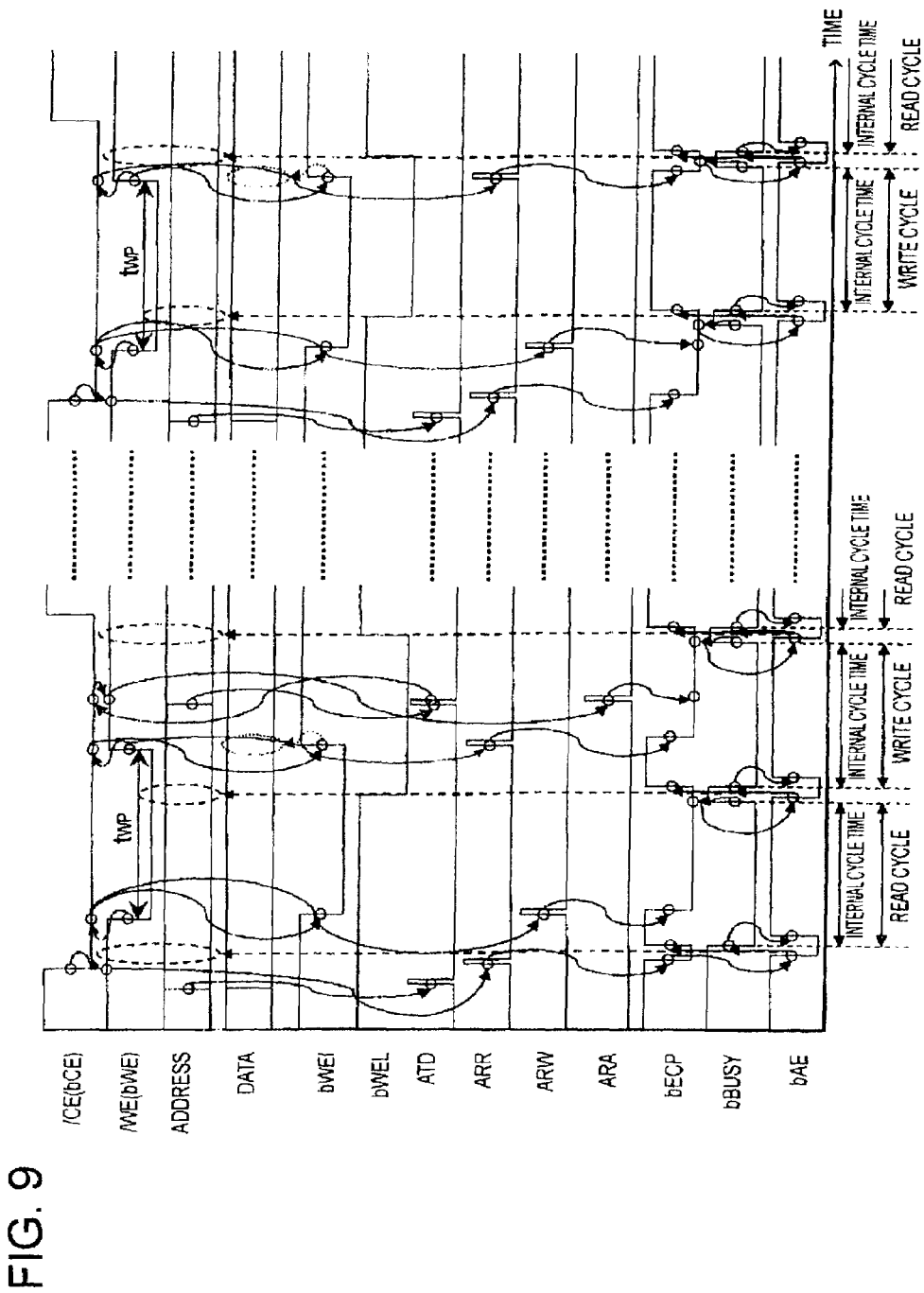
FIG. 9 is a timing chart illustrating write and read operations of the asynchronous pseudo SRAM illustrated in FIG. 1, in which the first half illustrates the operations when a write request comes in while the memory cell array is not accessed, and the latter half illustrates the operations when a write request comes in while the memory cell array is accessed or refreshed.

The first half (left half) of FIG. 9 illustrates a case in which a write request comes in while the memory cell array 11 is not accessed, specifically a case in which the chip enable signal /CE is activated to L level and the write enable signal /WE is subsequently activated to L level, while the busy signal bBUSY is at H level.

First, since the write enable signal /WE is at H level when the chip enable signal /CE falls, the access request signal generating circuit 20 generates the pulse-form read access request signal ARR. In response thereto, the access wait circuit 21 activates the access wait signal bECP to L level. Since the busy signal bBUSY is inactive (H level) at this time, the access activation circuit 15 immediately activates the access enable signal bAE to L level. Since the internal write enable signal bWEI is inactive (H level) at this time, the array control Circuit 12 starts a read operation in response to activation of the access enable signal bAE, and activates the busy signal bBUSY to L level. In addition, the latch circuit 17 latches address signals A1-An and the write enable signal bWE in response to activation of the access enable signal bAE, and provides the array control circuit 12 with the same as the write enable signal bWEL. The array control circuit 12 may determine that this cycle is a read operation, in response to the latched write enable signal bWEL. Moreover, the access wait circuit 21 resets the access wait signal bECP to H level in response to activation of the access enable signal bAE, and returns to a state ready for receiving the next access request. When the busy signal bBUSY is activated, the access activation circuit 15 resets the access enable signal bAE at H level.

Subsequently, when the write enable signal /WE falls while the chip enable signal /CE is being at L level, the OR circuit 16 activates the internal write enable signal bWEI to L level, and at the same time the access request signal generating circuit 20 generates the pulse-form write access request signal ARW. In response thereto, the access wait circuit 21 re-activates the access wait signal bECP to L level. At this time, since the memory cell array 11 has already entered a read cycle and cannot start next access operation until the read operation is finished, the array control circuit 12 maintains the busy signal bBUSY at L level. Hence, this write request is forced to wait and the access wait signal bECP is also maintained at L level.

When the internal cycle time has elapsed and a read operation is finished, the array control circuit 12 resets the busy signal bBUSY to H level. Since the access wait signal bECP is active (L level) at this time, the access activation circuit 15 activates the access enable signal bAE to L level. Since the internal write enable signal bWEI is active (L level) at this time, the array control circuit 12 starts a write operation in response to activation of the access enable signal bAE, and activates the busy signal bBUSY to L level. In addition, the latch circuit 17 latches the address signals A1-An for writing in response to activation of the access enable signal bAE, and provides the array control circuit 12 with the same. The latch circuit 17 also latches the write enable signal bWE at L level and provides the array control circuit 12 with the same as the write enable signal bWEL. The array control circuit 12 may determine this cycle to be a write operation in response to the latched write enable signal bWEL.

When the external write enable signal /WE rises, after elapsing of the time of the write signal pulse width tWP from the falling edge of the external write enable signal /WE, the internal write enable signal bWEI also rises. Since the latched write enable signal bWEL is active (L level) at this time, the array control circuit 12 imports input data signals DI1-DIm in the memory cell array 11 in response to the latched address signals A1-An, and then writes the data into the memory cells 18. Since the internal cycle time is sufficiently shorter as compared with the write signal pulse width tWP, the write operation is started before the rise of the write enable signal /WE, and the input data signals DI1-DIm are reliably written.

Since the chip enable signal /CE is active (L level) when the external write enable signal /WE rises, the access request signal generating circuit 20 generates the read access request signal ARR. In response thereto, the access wait circuit 21 activates the access wait signal bECP to L level. At this time, since the memory cell array 11 is in the write operation and the busy signal/BUSY is active (L level), this read request is forced to wait.

In this example, since the address signals A1-An have transited before this read operation is started, the ATD circuit 19 generates the address transition detection signal ATD. Since the chip enable signal /CE is at L level, while the write enable signal /WE is being at H level at this time, the access request signal generating circuit 20 generates the address access request signal ARA. However, since the access wait signal bECP is already at L level, the same is maintained as it is.

Subsequently, when the internal cycle time has elapsed and a write operation is finished, the array control circuit 12 resets the busy signal bBUSY to H level. As with the above, since the access wait signal bECP is active (L level), the access activation circuit 15 activates the access enable signal bAE to L level. Hence, the latch circuit 17 latches the address signals A1-An for reading. The array control circuit 12 reads data signals from the memory cell array 11 in response to the latched address signals A1-An.

Here, a read operation is performed in response to the address signals A1-An after the transition, and the previous read request at the time of rise of the write enable signal /WE is disregarded as a result. Even if a read operation is performed in response to the disregarded read request, the read output data signals DO1-DOm are overwritten by the output data signals DO1-DOm read out in accordance with the subsequent read request. Therefore, the disregarded read request is a request for which any read operation did not have to be performed at all. In this manner, any unnecessary read operation is not performed.

On the other hand, the latter half (right hall) of FIG. 9 illustrates a case in which a write request is received during the memory cell array 11 is accessed or refreshed, specifically a case in which the chip enable signal /CE is activated to L level and the write enable signal /WE is subsequently activated to L level while the busy signal bBUSY is at L level.

Since the busy signal bBUSY is active (at L level) unlike the case stated above, when the chip enable signal /CE falls, the access wait circuit 21 activates the access wait signal bECP to L level and maintains the same as the case now stands. Namely, this read request is forced to wait.

Next, when the write enable signal /WE falls, the access request signal generating circuit 20 generates the write access request signal ARW. Since the busy signal bBUSY is still active (at L level) and the access wait signal bECP is already active (at L level) at this time, this write request is also forced to wait.

Subsequently, when the busy signal bBUSY is reset to H level, the access activation circuit 15 activates the access enable signal bAE to L level. In response thereto, the array control circuit 12 starts a write operation, and the latch circuit 17 latches address signals A1-An and the write enable signal bWE being at L level, and provides the array control circuit 12 with the same.

When the external write enable signal /WE rises after elapse of the time of the write signal pulse width tWP from the falling edge of the external write enable signal /WE, the array control circuit 12 imports input data signals DI1-DIm into the memory cell array 11 in response to the latched address signals A1-An. In addition, written data is read out in response to the read request caused by the rise of the write enable signal /WE. This is the same operation as that of ordinary asynchronous SRAMs. It is also possible to omit the read operation by the array control circuit 12, by using a manner similar to that in another embodiment described hereinafter, while securing the reading of proper data. Details thereof will be described hereinafter.

In this manner, since a write request has already come when the busy signal bBUSY is reset, any previous read requests are disregarded. However, since data to be read here is the data which is to be rewritten by the next write operation, it is useless to output the data. Accordingly, these useless read operations are not performed in this case, either.

While unnecessary read requests are disregarded in this embodiment, it is also conceivable that such an ordinary waiting control as stacking all of the received requests is adopted. The ordinary waiting control may seem to be a safe control in the sense that all the operations having been forced to wait are certainly performed, but, since all of the operations are sequentially performed, correct operations may fail to be performed in pseudo SRAM. For example, in the operation in the latter half illustrated in FIG. 9, if a read operation is performed without disregard of the read request received first, the write enable signal /WE rises up before a write operation is started, and this causes the correct write operation not to be performed. In order to realize the correct write operation, it is necessary to perform considerably complicated control.

Although there are a variety of combinations and timing relationships of input signals for starting the operations of asynchronous SRAMs, the input signals are classified into three kinds of access request signals ARR, ARW, and ARA by the access request signal generating circuit 20 illustrated in FIG. 3, and are further combined into one kind of access wait signal bECP by the access wait circuit 21 illustrated in FIG. 5. Since these circuits are simple and small in size, and both reading and writing are processed by the common access wait signal bECP, the control after the access wait signal bECP, and the circuits thereof also become simple and small in sizes. Complicated stack circuits used for usual waiting control are not used, either.

Figure 10:
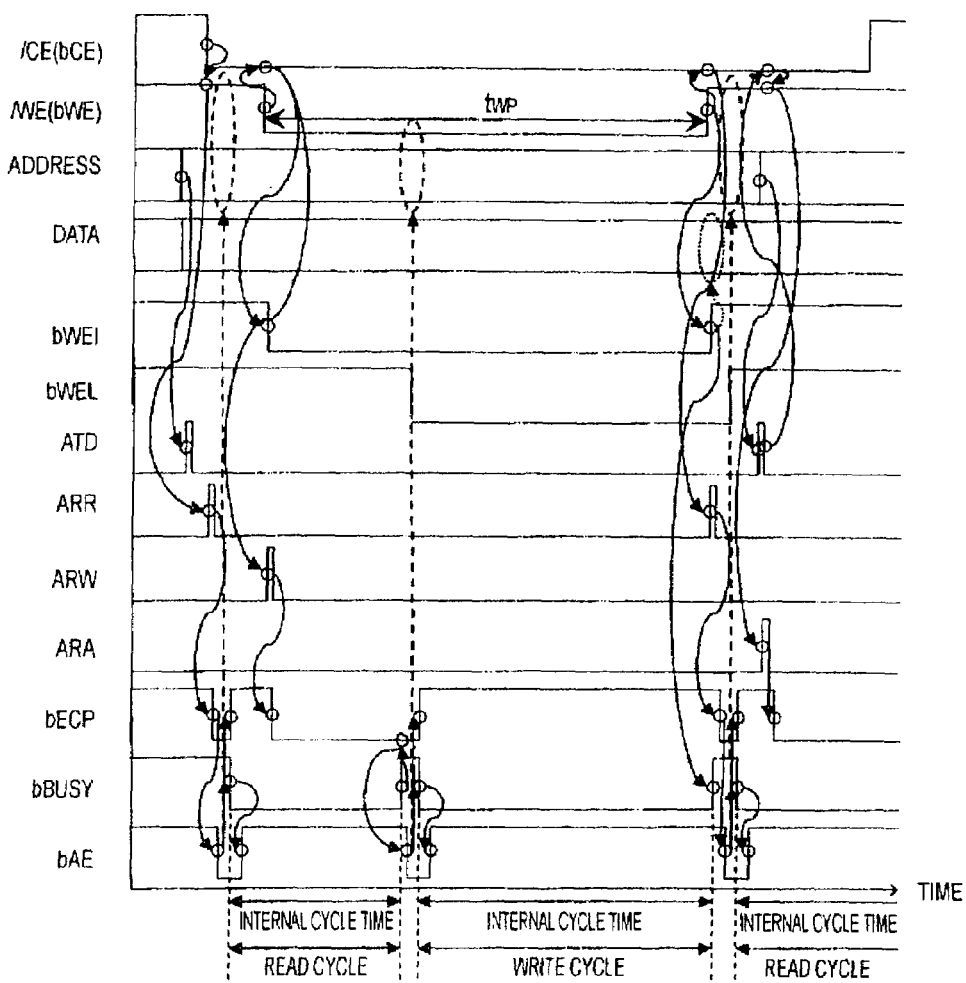
FIG. 10 is a timing chart illustrating the operation when a write signal pulse width illustrated in the first half of FIG. 9 becomes longer.
Figure 11:
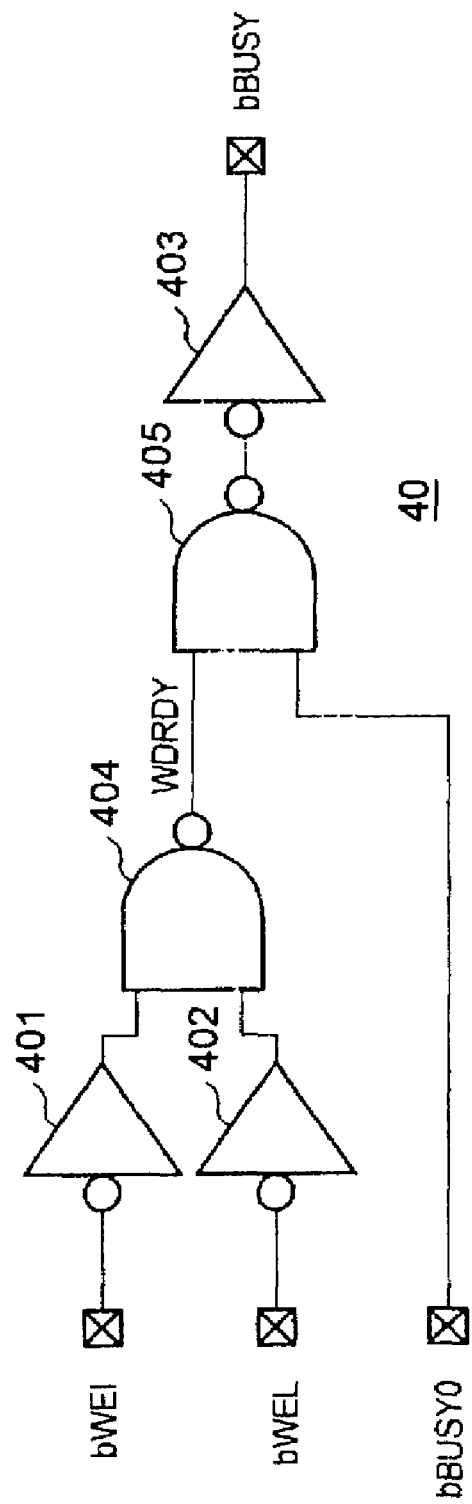
FIG. 11 is a circuit diagram illustrating an example of the busy control circuit considering the case where the write signal pulse width illustrated in FIG. 10 is long.

Next, FIG. 10 illustrates the operation in a case when the write signal pulse width tWP gets even longer in the first half operation of FIG. 9. Since a write operation is not finished as long as the external write enable signal /WE is not reset to H level, the busy signal bBUSY is maintained at L level while the internal write enable signal bWEI is at L level. FIG. 11 illustrates an example of a circuit for this case.

Referring to FIG. 11, a busy control circuit 40 contains inverters 401-403, and NAND circuits 404 and 405, and is disposed in the array control circuit 12. A busy signal bBUSY0 indicates L level meaning the active state during the time from the start of the internal cycle to the elapse of the shortest internal cycle time, and indicates H level meaning the inactive state, before the start of the internal cycle and after the elapse of the shortest internal cycle time from the start of the internal cycle. However, by incorporating the internal write enable signal bWEI into the internal cycle control without separately generating such a busy signal bBUSY0, in the array control circuit 12, it is also possible to make the busy signal bBUSY to stay at L level in a natural way while the internal write enable signal bWEI stays at L level.

When the input of write data is delayed in this manner, a write operation is forced to wait by the internal enable signal bWEI, and this causes the write cycle to be extended, resulting in the elongation of the internal cycle time. According to the present invention, it is possible to respond, in a natural way, to the long write cycle allowed in the specifications of asynchronous SRAMs without using a separate system of circuits for write cycles as described in the Japanese Unexamined Patent Publication No. 2003-308692 discussed herein above. It is the same in asynchronous SRAMs that the write cycle (both the external and internal cycles) gets longer when input data is delayed.

As described herein above, since an access (read or write) operation of the memory cell array 11 is performed in accordance with the level of the internal write enable signal bWE at the time the access enable signal bAE becomes L level, the last access request of the access requests that have come within the time the access wait signal bECP stays at L level becomes effective, and the requests that have come prior to the time thereof are disregarded as a result. Since the disregarded access requests do not contribute to the final state, any useless internal operations are not performed. This causes an idle time of the memory cell array 11 to get longer, and enables using the idle time for refreshing or other necessary operations. As a result, the accessibility to the memory cell array 11 increases and power consumption is reduced.

However, only read operations are disregarded and the write operations are certainly performed. This is on the basis of the specifications of asynchronous SRAMs. In asynchronous SRAMs, specifications require to set the write signal pulse width tWP to be relatively long so as to reliably perform intended writing of data and to prevent unintended writing of data from arising. For that reason, the minimum value of the write signal pulse width tWP is sufficiently longer than that of the internal cycle time of usual pseudo SRAMs. As a result, even if the memory cell array 11 starts a read or refresh operation before the write enable signal /WE falls, the operation is finished before the write enable signal /WE rises, and the next operation is started.

Also according to specifications of asynchronous SRAMs, it is inhibited to change the address signals A1-An or the chip enable signal /CE while the write enable signal /WE stays at L level, for the reason mentioned above. Hence, a new access request does not come after a write request comes, and the write request is always the newest access request. Thus, the write request is not disregarded, and the write operation is reliably performed.

The memory cell array 11 starts a series of operations in response to the access enable signal bAE or the refresh enable signal bREFENB, and simultaneously activates the busy signal bBUSY to notify the access activation circuit 15 that any new access cannot be received. Namely, the activated busy signal bBUSY resets the access enable signal bAE, and inhibits generation of the access enable signal bAE. For that reason, the access wait signal bECP is not reset but kept activated while the access enable signal bAE is inhibited, and the access request is forced to wait.

As described above, even though the asynchronous pseudo SRAM 10 is simple in the circuit configuration thereof and small in circuit size, the same not only satisfies specifications of asynchronous SRAMs but also has compatibility with asynchronous SRAMs in terms of operation.

In the embodiment described above with reference to FIG. 1, when the write signal pulse width tWP is long as illustrated in FIG. 10, the internal cycle time also gets longer, and it is not possible to release the memory cell array 11 and the array control circuit 12 for performing the refresh operation or the like during that long time. Another embodiment of the present invention adopts a so-called late write method.

Figure 12:
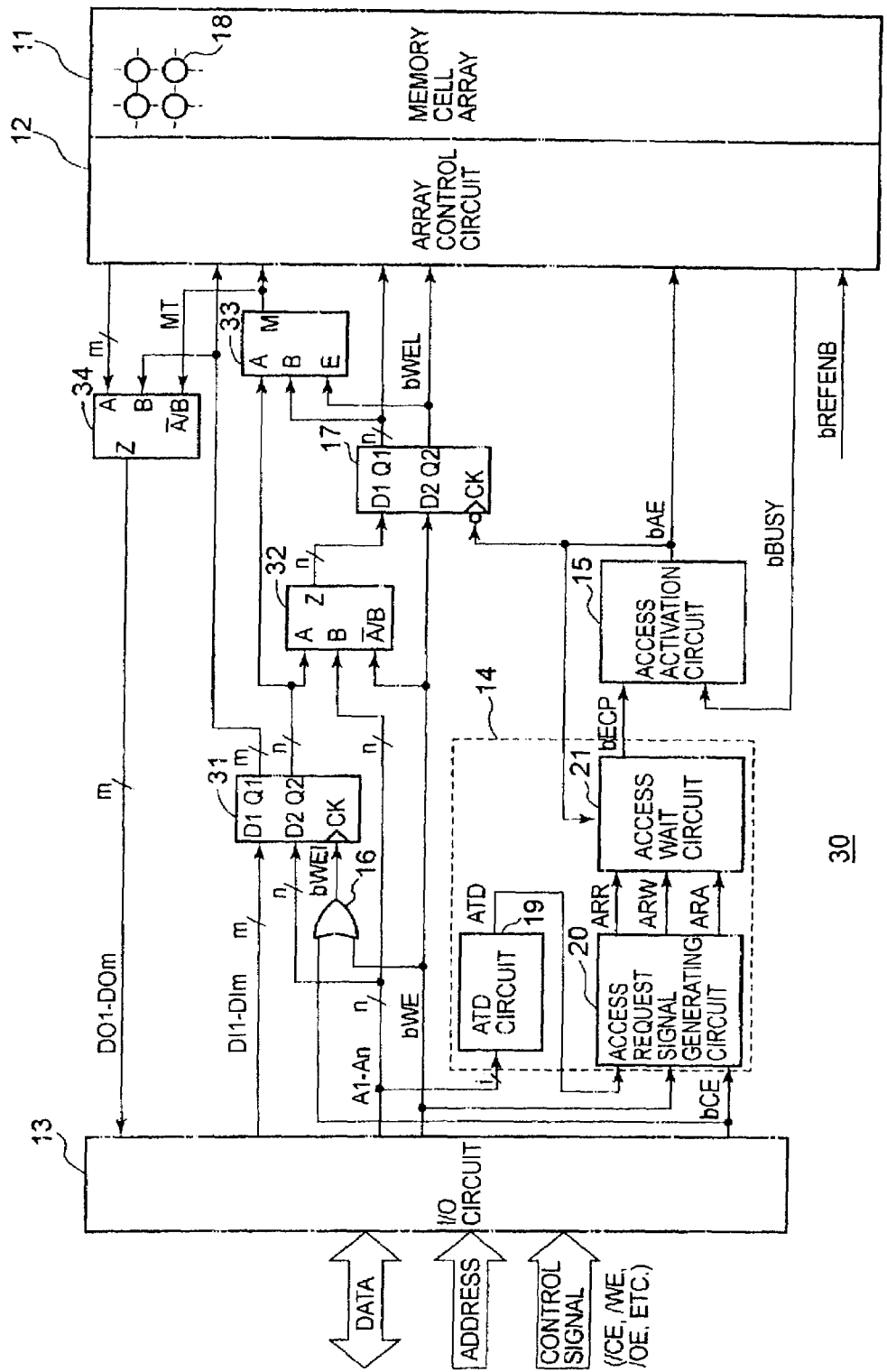
FIG. 12 is a functional block diagram illustrating a configuration of an asynchronous pseudo SRAM according to another embodiment of the present invention.

Referring to FIG. 12, an asynchronous pseudo SRAM 30 according another embodiment of the invention is provided with a register 31, an address selector 32, an address comparator 33, and a data selector 34, in addition to the elements of the embodiment described with reference to FIG. 1. The register 31 temporarily holds the address signals A1-An and input data DI1-DIm provided from outside of the asynchronous pseudo SRAM 30, when the internal write enable signal bWEI is inactivated to H level. The address selector 32 selects the address signals A1-An held by the register 31 when the write enable signal bWE is activated and selects the address signals A1-An provided from outside of the asynchronous pseudo SRAM 30 when the write enable signal bWE is inactivated, to provide the selected address signals A1-An to the latch circuit 17. The address comparator 33 is activated when the write enable signal bWEL is inactive. The activated address comparator 33 compares the address signals A1-An held by the register 31 with the address signals A1-An latched by the latch circuit 17. The address comparator 33 activates a match signal MT to H level when these address signals match with each other and inactivates the match signal MT to L level when these address signals do not match with each other. The data selector 34 selects input data DI1-DIm held by the register 31 when the match signal MT is active (at H level), and selects read data from the array control circuit 12 when the match signal MT is inactive (at L level), to provide the selected data to the I/O circuit 13 as output data DO1-DOm. In this embodiment, since it is not necessary to extend the active (L level) state of the busy signal bBUSY by the internal write enable signal bWEI, as is performed by the busy control circuit 40 illustrated in FIG. 11, the array control circuit 12 does not have to monitor the internal write enable signal bWEI.

Next, operation of asynchronous pseudo SRAM 30 will be described.

When the write enable signal /WE (bWE) is at H level, the address signals A1-An provided from outside of the asynchronous pseudo SRAM 30 at that time are selected by the address selector 32 and provided to the latch circuit 17. Hence, the read operation is the same as that of the embodiment described above with reference to FIG. 1. On the other hand, when the write enable signal /WE (bWE) is at L level, address signals A1-An stored in the register 31 are selected by the address selector 32 and provided to the latch circuit 17. Hence, the write operation differs from that of the embodiment described with reference to FIG. 1 as follows.

Figure 13:
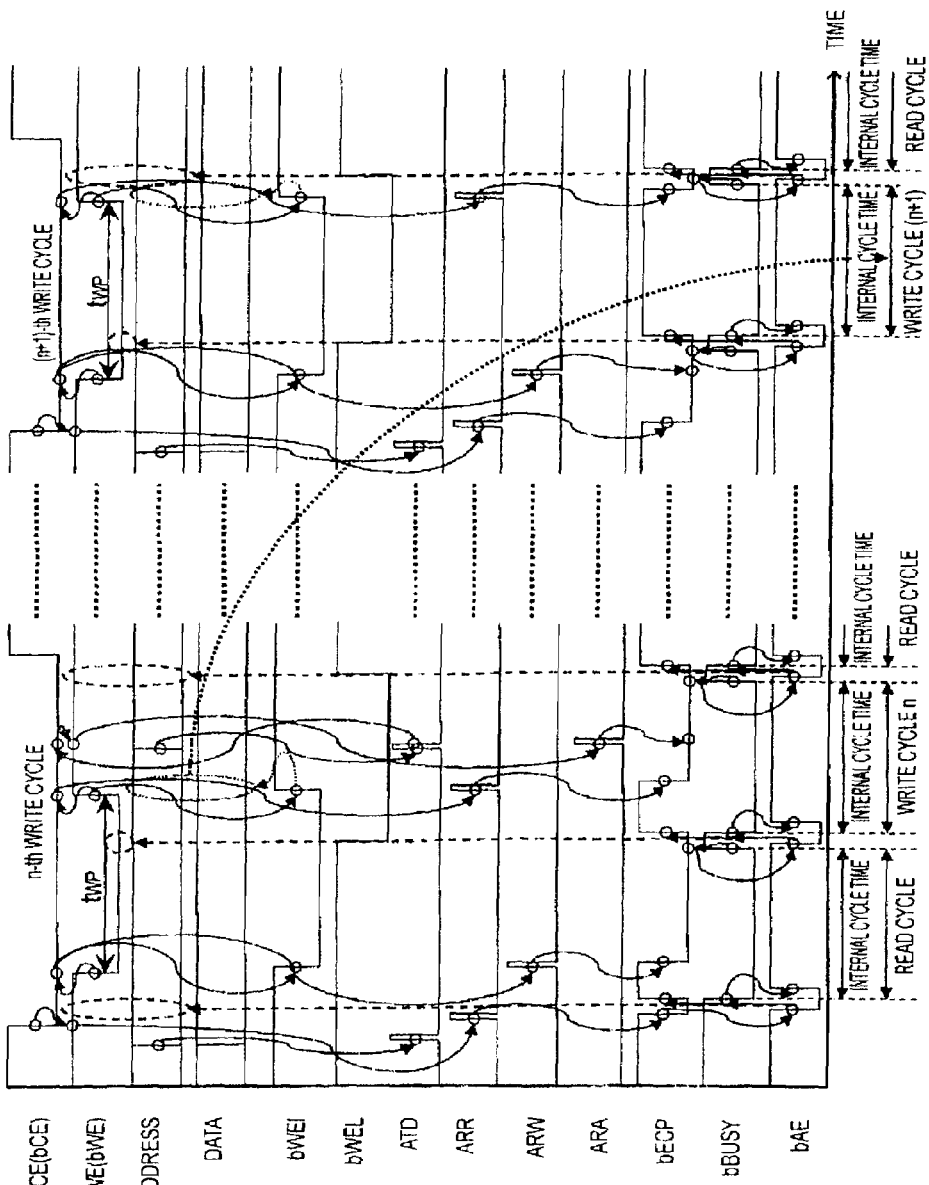
FIG. 13 is a timing chart illustrating write and read operations of the asynchronous pseudo SRAM illustrated in FIG. 12.

Referring to FIG. 13, when the internal write enable signal bWEI rises in the n-th write cycle, the address signals A1-An and input data signals DI1-DIm provided from outside of the asynchronous pseudo SRAM 30 at that time arc temporarily stored in the register 31. In the next (n+1)-th write cycle, data signals DI1-DIm stored in the register 31 is written into the memory cell array 11 in response to the address signals A1-An stored in the register 31.

More specifically, after the chip enable signal /CE (bCE) falls and when the write enable signal /WE (bWE) also falls, the internal write enable signal bWEI falls and the pulse-form write access request signal ARW is outputted. Then, when the busy signal bBUSY rises, the access enable signal bAE falls, and the array control circuit 12 and the memory cell array 11 go into the internal write cycle. When the access enable signal bAE falls, the address signals A1-An which are stored in the register 31 and selected by the address selector 32, and the internal write enable signal bWEI, are latched by the latch circuit 17, and provided to the array control circuit 12. The array control circuit 12 imports input data signals DI1-DIm stored in the register 31 in response to the access enable signal bAE. Hence, the array control circuit 12 writes input data DI1-DIm stored in the register 31 into the memory cell array 11 in response to the address signals A1-An stored in the register 31.

In this manner, since actual writing of input data into the memory cell array 11 is carried over to the next write cycle, the input data does not exist in the memory cell array 11 when the read request of the input data comes before going into the next write cycle. Then, in order to provide to the outside of the asynchronous pseudo SRAM 30 the input data temporarily held by the register 31 as output data, address signals stored in the register 31 are compared with address signals latched by the latch circuit 17, and when these address signals match with each other, the match signal MT coming from the address comparator 33 is activated, and thereby, input data stored in the register 31 is selected by the data selector 34 and outputted as output data DO1-DOm.

Figure 14:
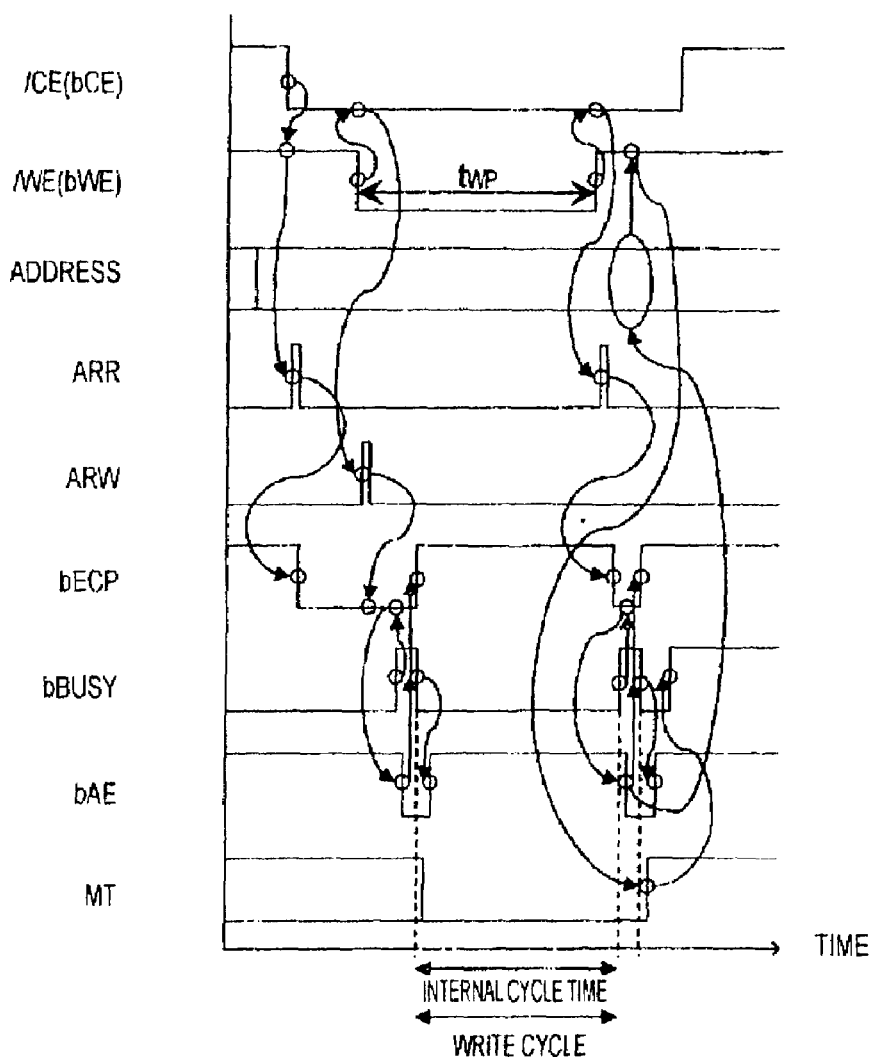
FIG. 14 is a timing chart illustrating a case in which control is performed such that the read operation after writing is omitted by using the match signal in the asynchronous pseudo SRAM illustrated in FIG. 12.

The array control circuit 12 may perform a read operation in response to activation of the access enable signal bAE, but, since the data to be read out is old data to be overwritten and is not outputted to the outside of the asynchronous pseudo SRAM 30, this results in a waste of the read operation itself. Therefore, it is preferable to provide the match signal MT also to the array control circuit 12, and to control the busy signal bBUSY as illustrated in FIG. 14. Namely, when the match signal MT is at H level, the array control circuit 12 once activates the busy signal bBUSY, and immediately thereafter, inactivates the same, without performing the read operation. In this case, it is possible to assign the time saved by omitting the read operation to the refresh operation which reduces the probability of conflicts between the external accesses and refresh operations. As a result, it is possible to increase the availability of the memory cell array 11 for external accesses.

According to this embodiment described with reference to FIG. 12, adoption of the late write is not visible from outside of the asynchronous pseudo SRAM 30, and the consistency of data is also maintained. When the late write is adopted to pseudo SRAMs, it is possible to shorten the internal write cycle even if the external write cycle is long by separating the internal write cycle from the external write cycle. Hence, this enables to always perform internal cycles with the identical cycle time without changing the timing control of internal control signals for the write cycle.

When the external write cycle is long, spare time is produced internally after the internal write cycle is finished. Hence, it becomes possible to perform refresh operations or other internal processing by effectively using the spare time. This leads to reducing the possibility that external accesses are forced to wait due to refresh operations which results in reduction in a substantial refresh busy rate as a whole, which in turn results in facilitation of improvement in the performance even for rather long internal cycle times and also leads to reduction in consumption of electric power.

Figure 15:
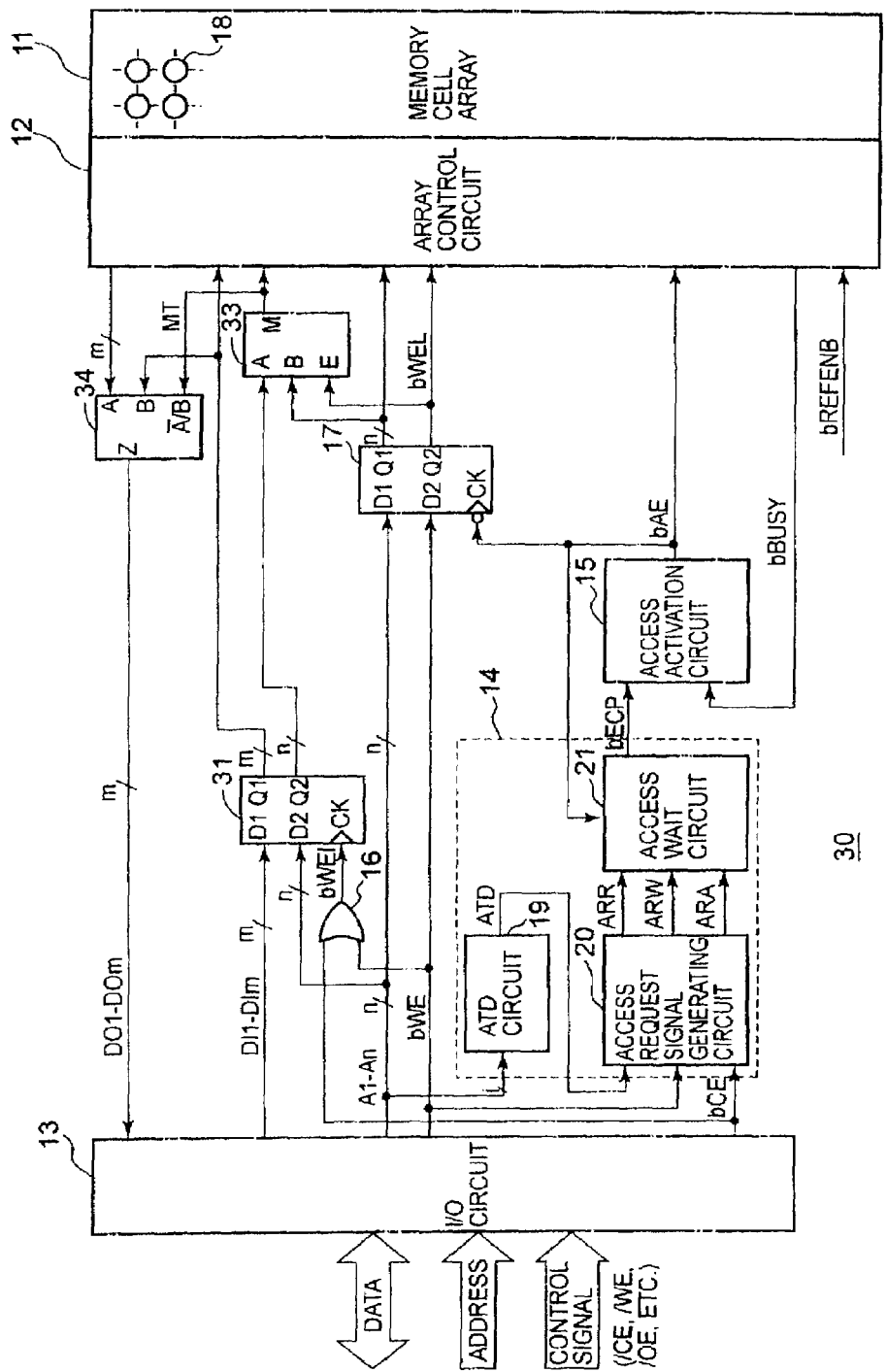
FIG. 15 is a functional block diagram illustrating a configuration of an asynchronous pseudo SRAM according to yet another embodiment of the present invention.

In the embodiment described above with reference to FIG. 1, the array control circuit 12 performs the writing-in operation of data in response to the rise of the write enable signal /WE, and performs the read operation of the data in response to the read request caused by the rise of the write enable signal /WE, but in yet another embodiment described herein below, it is possible to omit such a read operation by the array control circuit 12 while outputting proper data. Specifically, as illustrated in FIG. 15, and as in the case of the embodiment described above with reference to FIG. 1 in which the address selector 32 illustrated in FIG. 12 is not provided, the address signals Al-An are directly provided to the latch circuit 17, and the internal write enable signal bWEI and input data DI1-DIm are provided to the array control circuit 12. The register 31, the address comparator 33, and the data selector 34 are provided, as in the case of the embodiment described above with reference to FIG. 12, however, those elements do not perform the late writing. By configuring in this manner, the array control circuit 12 does not perform the read operation when the match signal MT is at H level, but instead, the data selector 34 outputs data stored in the register 31, and therefore, it is possible to output proper data in response to the read request involved in the rise of the write enable signal /WE. In addition, also in arbitrary read requests to read data from the same address as that of a write operation after that write operation, it is possible to output proper data, while omitting internal read operations from the array.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fill within the scope of the appended claims.

The invention claimed is:

1. An asynchronous semiconductor memory device wherein a read request or a write request of data is provided at arbitrary timing, the asynchronous semiconductor memory device comprising:
   a memory cell array comprising dynamic memory cells;
   an array control circuit that is activated in response to an access enable signal, the array control circuit reads data from or writes data in the memory cell array in response to address signals, and the array control circuit activates a busy signal during reading or writing of data;
   an access reception circuit for receiving the read request or the write request to activate an access wait signal, and for inactivating the access wait signal in response to the access enable signal;
   an access activation circuit for activating the access enable signal in response to activation of the access wait signal and inactivation of the busy signal;
   the access reception circuit comprises;
      an access request signal generating circuit for activating access request signals in response to the read request or the write request; and
      an access wait circuit for activating the access wait signal in response to activation of the access request signal and inactivating the access wait signal in response to the access enable signal;
   the access reception circuit further comprises:
      an address transition detection circuit for detecting transition of address signals to generate an address transition detection signal;
      the access request signal generating circuit activates a read access request signal in response to activation of a chip enable signal and inactivation of a write enable signal, activates a write access request signal in response to activation of the chip enable signal and activation of the write enable signal, and activates an address access request signal in response to activation of the chip enable signal, inactivation of the write enable signal and activation of the address transition detection signal and
      the access wait circuit activates the access wait signal in response to activation of the read access request signal, the write access request signal, or the address access request signal.

2. The asynchronous semiconductor memory device according to claim 1, wherein
   the access wait circuit comprises:
      a first transistor coupled between a first power node and a state node;
      means for turning on the first transistor for a predetermined period in response to the access enable signal;

a second transistor coupled between the first power node and the state node;

a third transistor coupled between a second power node and the state node;

an inverter having an input terminal coupled to the state node and an output terminal coupled to a gate of the second transistor and a gate of the third transistor;

a fourth transistor coupled between the second power node and the state node, and having a gate for receiving a read access request signal;

a fifth transistor coupled between the second power node and the state node, and having a gate for receiving a write access request signal; and a sixth transistor coupled between the second power node and the state node, and having a gate for receiving an address access request signal; wherein driving capabilities of the second and third transistors are less than driving capabilities of the first, fourth, fifth and sixth transistors.

* * * * *